US008760048B2

(12) United States Patent
Fukuda et al.

(10) Patent No.: US 8,760,048 B2

(45) Date of Patent: Jun. 24, 2014

(54) ORGANIC LAYER INCLUDING MULTIPLE REFLECTIVE INTERFACES FOR LIGHT EMITTING ILLUMINATION, AND DISPLAY APPARATUSES

(71) Applicant: Sony Corporation, Tokyo (JP)

(72) Inventors: Toshihiro Fukuda, Kanagawa (JP); Jiro Yamada, Kanagawa (JP); Yohei Ebihara, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/742,083

(22) Filed: Jan. 15, 2013

(65) Prior Publication Data

US 2013/0127334 A1 May 23, 2013

Related U.S. Application Data

(63) Continuation of application No. 13/010,991, filed on Jan. 21, 2011, now Pat. No. 8,373,342.

(30) Foreign Application Priority Data

Jan. 29, 2010 (JP) ............................... P2010-018493

(51) Int. Cl.
*H01L 51/50* (2006.01)
*H05B 33/22* (2006.01)

(52) U.S. Cl.
CPC ..................................... *H05B 33/22* (2013.01)
USPC .......................................................... 313/506

(58) Field of Classification Search
None
See application file for complete search history.

(56) References Cited

U.S. PATENT DOCUMENTS

| | | | |
|---|---|---|---|
| 6,831,409 | B2 | 12/2004 | Yamada |
| 7,102,282 | B1 | 9/2006 | Yamada et al. |
| 7,218,049 | B2 | 5/2007 | Yamada et al. |
| 7,224,114 | B2 | 5/2007 | Yamada et al. |
| 7,602,117 | B2 | 10/2009 | Yamada et al. |
| 7,710,025 | B2 | 5/2010 | Yamada et al. |

FOREIGN PATENT DOCUMENTS

| | | |
|---|---|---|
| JP | 2002-243573 | 9/2000 |
| JP | 2002-289358 | 10/2002 |
| JP | 2003-123987 | 4/2003 |
| JP | 3508741 | 3/2004 |
| JP | 2006-244712 | 9/2006 |
| JP | 2006-244713 | 9/2006 |
| JP | 2007-012370 | 1/2007 |
| JP | 2007-234253 | 9/2007 |
| WO | 01/39554 | 5/2001 |

OTHER PUBLICATIONS

Japanese Office Action issued in connection with related Japanese Patent Appl. No. 2010-018493 dated Jul. 23, 2013.

*Primary Examiner* — Britt D Hanley

(74) *Attorney, Agent, or Firm* — Dentons US LLP

(57) ABSTRACT

A light-emitting apparatus including light-emitting devices emitting light of different single colors in a visible wavelength region, wherein each light-emitting device including: an organic layer between first and second electrodes and in which a first or second light-emitting layer emitting light of a different single color is included at a first or second position separated from each other in a direction from the first electrode to the second electrode; a first reflective interface on the side of the first electrode; and a second reflective interface and a third reflective interface which on the side of the second electrode in that order at mutually separated positions in a direction from the first electrode to the second electrode.

14 Claims, 16 Drawing Sheets

ORGANIC LAYER INCLUDING MULTIPLE REFLECTIVE INTERFACES FOR LIGHT EMITTING ILLUMINATION, AND DISPLAY APPARATUSES

RELATED APPLICATION DATA

This application is a continuation of U.S. patent application Ser. No. 13/010,991 filed Jan. 21, 2011, the entirety of which is incorporated herein by reference to the extent permitted by law. The present application also claims priority to Japanese Priority Patent Application No. JP2010-018493 filed Jan. 29, 2010, the entirety of which is incorporated by reference herein to the extent permitted by law.

FIELD OF THE INVENTION

This invention relates to a light-emitting apparatus, an illumination apparatus, and a display apparatus. More specifically, the invention relates to a light-emitting apparatus, an illumination apparatus, and a display apparatus which uses a light-emitting device that uses electroluminescence of an organic material.

DESCRIPTION OF THE RELATED ART

Light-emitting devices (hereinafter referred to as organic EL devices) which use electroluminescence of an organic material have attracted attention as a light-emitting device capable of emitting high-luminance light with low-voltage direct-current driving and have been actively researched and developed. The organic EL device has a structure in which an organic layer having a light-emitting layer that generally has a thickness of about several tens to several hundreds of nm is interposed between a reflective electrode and a translucent electrode. In such an organic EL device, light emitted from the light-emitting layer is extracted to the outside after undergoing interference in the device structure. In the related art, several attempts have been made to improve emission efficiency of the organic EL device using such interference.

JP-A-2002-289358 discloses a technique in which a distance from an emission position to a reflective layer is set so as to allow light having an emission wavelength to resonate using interference of light emitted from a light-emitting layer towards a translucent electrode and light emitted towards a reflective electrode, thus enhancing emission efficiency.

JP-A-2000-243573 defines a distance from an emission position to a reflective electrode and the distance from the emission position to an interface between a translucent electrode and a substrate by taking reflection of light at the interface between the translucent electrode and the substrate into consideration.

WO01/039554 discloses a technique in which the thickness of a layer between a translucent electrode and a reflective electrode is set so as to allow light having a desired wavelength to resonate using interference of light occurring when light undergoes multiple reflections between the translucent electrode and the reflective electrode, thus enhancing emission efficiency.

Japanese Patent No. 3508741 discloses a method of controlling an attenuation balance of the three colors red (R), green (G), and blue (B) by controlling the thickness of an organic layer as a method of improving the viewing angle characteristics of a white chromaticity point in a display apparatus having a light-emitting device in which emission efficiency is enhanced using a cavity structure.

The techniques mentioned above are directed to an organic EL device which uses interference of emitted light in order to enhance emission efficiency. In such an organic EL device, when the bandwidth of an interference filter for extracted light h narrows, the wavelength of the light h shifts largely when the emission surface is viewed from an oblique direction, and the emission intensity decreases. Thus, the viewing-angle dependency of emission characteristics increases.

In contrast, JP-A-2006-244713 discloses a technique in which the phase of light emission by a reflective layer of an organic EL device having a narrow single-color spectrum and the interference by a single reflective layer provided on the light emitting side are set to be in an opposite phase to the central wavelength, thus suppressing a variation of hue in accordance with a viewing angle. In this case, the luminance and viewing angle characteristics can be maintained for a single color by using one emission wavelength for one light-emitting device and limiting the number of reflective interfaces to one. However, a wavelength range sufficient for suppressing a variation in hue is not obtained. Moreover, it is necessary to increase the reflectance to increase the degree of cancellation in order to broaden the wavelength range. In this case, the emission efficiency decreases greatly.

SUMMARY OF THE INVENTION

It is therefore desirable to provide a light-emitting apparatus which is capable of effectively extracting light in a wide wavelength range and greatly reducing a viewing-angle dependency of luminance and hue with respect to light of a single color, and which can be easily manufactured with high productivity.

It is also desirable to provide an illumination apparatus which has a small viewing-angle dependency and good intensity distribution properties, and which can be easily manufactured with high productivity.

It is also desirable to provide a display apparatus which has a good display quality and a small viewing-angle dependency, and which can be easily manufactured with high productivity.

According to an embodiment of the present invention, there is provided a light-emitting apparatus including:

a plurality of light-emitting devices emitting light of different single colors in a visible wavelength region, wherein each of the plurality of light-emitting devices includes an organic layer which is interposed between a first electrode and a second electrode and in which a first light-emitting layer or a second light-emitting layer emitting light of different single colors is included at a first position or a second position separated from each other in a direction from the first electrode to the second electrode;

a first reflective interface which is provided on the side of the first electrode so as to reflect light emitted from the first light-emitting layer or the second light-emitting layer to be emitted from the side of the second electrode; and a second reflective interface and a third reflective interface which are provided on the side of the second electrode at mutually separated positions in that order in a direction from the first electrode to the second electrode, wherein when the optical distance between the first reflective interface and the luminescent center of the first light-emitting layer is L11, the optical distance between the first reflective interface and the luminescent center of the second light-emitting layer is L21, an optical distance between the luminescent center of the first light-emitting layer and the second reflective interface is L12, an optical distance between the luminescent center of the second light-emitting layer and the second reflective interface is L22, an optical distance between the luminescent center of the first light-emitting layer and the third reflective interface is L13, an optical distance between the luminescent center of the second light-emitting layer and the third reflective interface is L23, the central wavelength of an emission spectrum of the first light-emitting layer is λ1, and the central wavelength of an emission spectrum of the second light-emitting layer is λ2, L11, L21, L12, L22, L13, and L23 satisfy all the expressions (1) to (6) and at least one of the expressions (7) and (8).

$$2L11/\lambda 11+\phi 1/2\pi=0 \quad (1)$$

$$2L21/\lambda 21+\phi 1/2\pi=n \text{ (where } n\geq 1) \quad (2)$$

$$\lambda 1-150<\lambda 11<\lambda 1+80 \quad (3)$$

$$\lambda 2-30<\lambda 21<\lambda 2+80 \quad (4)$$

$$\lambda L12/\lambda 12+\phi 2/2\pi=m'+1/2 \text{ and } 2L13/\lambda 13+\phi 3/2\pi=m'', \text{ or } 2L12/\lambda 12+\phi 2/2\pi=m' \text{ and } 2L13/\lambda 13+\phi 3/2\pi=m''+1/2 \quad (5)$$

$$2L22/\lambda 22+\phi 2/2\pi=n'+1/2 \text{ and } 2L23/\lambda 23+\phi 3/2\pi=n'', \text{ or } 2L22/\lambda 22+\phi 2/2\pi=n' \text{ and } 2L23/\lambda 23+\phi 3/2\pi=n''+1/2, \text{ or } 2L22/\lambda 22+\phi 2/2\pi=n'+1/2 \text{ and } 2L23/\lambda 23+\phi 3/2\pi=n''+1/2 \quad (6)$$

$$\lambda 22<\lambda 2-15 \text{ or } \lambda 23>\lambda 2+15 \quad (7)$$

$$\lambda 23<\lambda 2-15 \text{ or } \lambda 22>\lambda 2+15 \quad (8)$$

where m', m", n, n', n" are integers,

λ1, λ2, λ11, λ21, λ12, λ22, λ13, and λ23 are in units of nm,

ϕ1 is a phase shift occurring when light of each wavelength is reflected by the first reflective interface, ϕ2 is a phase shift occurring when light of each wavelength is reflected by the second reflective interface, and ϕ3 is a phase shift occurring when light of each wavelength is reflected by the third reflective interface.

According to another embodiment of the present invention, there is provided an illumination apparatus including:

a plurality of light-emitting devices emitting light of different single colors in a visible wavelength region, wherein each of the plurality of light-emitting devices includes an organic layer which is interposed between a first electrode and a second electrode and in which a first light-emitting layer or a second light-emitting layer emitting light of different single colors is included at a first position or a second position separated from each other in a direction from the first electrode to the second electrode;

a first reflective interface which is provided on the side of the first electrode so as to reflect light emitted from the first light-emitting layer or the second light-emitting layer to be emitted from the side of the second electrode; and a second reflective interface and a third reflective interface which are provided on the side of the second electrode at mutually separated positions in that order in a direction from the first electrode to the second electrode, wherein when the optical distance between the first reflective interface and the luminescent center of the first light-emitting layer is L11, the optical distance between the first reflective interface and the luminescent center of the second light-emitting layer is L21, an optical distance between the luminescent center of the first light-emitting layer and the second reflective interface is L12, an optical distance between the luminescent center of the second light-emitting layer and the second reflective interface is L22, an optical distance between the luminescent center of the first light-emitting layer and the third reflective interface is L13, an optical distance between the luminescent center of the second light-emitting layer and the third reflective interface is L23, the central wavelength of an emission spectrum of the first light-emitting layer is λ1, and the central wavelength of an emission spectrum of the second light-emitting layer is λ2, L11, L21, L12, L22, L13, and L23 satisfy all the expressions (1) to (6) and at least one of the expressions (7) and (8).

According to still another embodiment of the present invention, there is provided a display apparatus including:

a plurality of light-emitting devices emitting light of different single colors in a visible wavelength region, wherein each of the plurality of light-emitting devices includes an organic layer which is interposed between a first electrode and a second electrode and in which a first light-emitting layer or a second light-emitting layer emitting light of different single colors is included at a first position or a second position separated from each other in a direction from the first electrode to the second electrode;

a first reflective interface which is provided on the side of the first electrode so as to reflect light emitted from the first light-emitting layer or the second light-emitting layer to be emitted from the side of the second electrode; and a second reflective interface and a third reflective interface which are provided on the side of the second electrode at mutually separated positions in that order in a direction from the first electrode to the second electrode, wherein when the optical distance between the first reflective interface and the luminescent center of the first light-emitting layer is L11, the optical distance between the first reflective interface and the luminescent center of the second light-emitting layer is L21, an optical distance between the luminescent center of the first light-emitting layer and the second reflective interface is L12, an optical distance between the luminescent center of the second light-emitting layer and the second reflective interface is L22, an optical distance between the luminescent center of the first light-emitting layer and the third reflective interface is L13, an optical distance between the luminescent center of the second light-emitting layer and the third reflective interface is L23, the central wavelength of an emission spectrum of the first light-emitting layer is λ1, and the central wavelength of an emission spectrum of the second light-emitting layer is λ2, L11, L21, L12, L22, L13, and L23 satisfy all the expressions (1) to (6) and at least one of the expressions (7) and (8).

The luminescent centers of the first light-emitting layer and the second light-emitting layer mean a plane where the peaks of the emission intensity distribution in the thickness direction thereof are positioned. The luminescent center is generally a plane that evenly divides the thickness of each of the first light-emitting layer and the second light-emitting layer. In this case, the first and second positions are identical to the luminescent centers of the first and second light-emitting layers.

The expression (1) is an expression for setting the optical distance between the first reflective interface and the luminescent center of the first light-emitting layer so that light having the central wavelength of the emission spectrum of the first light-emitting layer is reinforced through interference between the first reflective interface and the luminescent center of the first light-emitting layer. The expression (2) is an expression for setting the optical distance between the first reflective interface and the luminescent center of the second light-emitting layer so that light having the central wavelength of the emission spectrum of the second light-emitting layer is reinforced through interference between the first reflective interface and the luminescent center of the second light-emitting layer. The expressions (5) and (6) are expressions for setting the constructive and destructive conditions for at least one of the reflection of light by the second reflective interface and the reflection of light by the third reflective interface while the interference wavelengths are shifted from the central wavelength of the emission spectrum of the first light-emitting layer and the central wavelength of the emission spectrum of the second light-emitting layer ($\lambda 12 \neq \lambda 13$ or $\lambda 22 \neq \lambda 23$). The expressions (7) and (8) are conditions for broadening the interference wavelengths. The values of $\lambda 11$, $\lambda 21$, $\lambda 12$, $\lambda 22$, $\lambda 13$, $\lambda 23$ in the expressions (1), (2), (5), and (6) are calculated from the values of $\lambda 1$ and $\lambda 2$ by the expressions (3), (4), (7), and (8).

The integers m', m'', n, n', and n'' are chosen as necessary. In order to increase the amount of light extracted from the light-emitting device, the integer n is preferably set as $n \leq 5$, and most preferably as n=1 or n=2.

According to this light-emitting apparatus, the peaks of the spectral transmittance curve of an interference filter of the light-emitting device can be made substantially flat in the visible wavelength region, or the slopes thereof can be made substantially the same in the wavelength range of all emission colors. Therefore, in this light-emitting apparatus, a decrease of luminance at a viewing angle of 45° with respect to light of a single color can be controlled to be 30% or less with respect to luminance at a viewing angle of 0°, and a chromaticity shift of $\Delta uv \leq 0.015$ can be obtained.

This light-emitting apparatus may be a top emission-type light-emitting apparatus and may be a bottom emission-type light-emitting apparatus. In a top emission-type light-emitting apparatus, the first electrode, the organic layer, and the second electrode are sequentially stacked on a substrate. In a bottom emission-type light-emitting apparatus, the second electrode, the organic layer, and the first electrode are sequentially stacked on a substrate. The substrate of the top emission-type light-emitting apparatus may be opaque and transparent, which is chosen as necessary. The substrate of the bottom emission-type light-emitting apparatus is transparent in order to extract light emitted from the side of the second electrode to the outside.

A metal layer having a thickness allowing transmission of visible light may be provided between the second light-emitting layer and the second electrode as necessary. The thickness of the metal layer may be 5 nm or less, and preferably 3 to 4 nm or less. The metal layer can be used as a semitransparent reflective layer.

One or plural reflective interfaces may be provided in addition to the first, second, and third reflective interfaces, as necessary. Moreover, at least one of the first, second, and third reflective interfaces may be divided into a plurality of reflective interfaces, as necessary. By doing so, it is possible to broaden a wavelength range in which the reflection of light by the second reflective interface and the reflection of light by the third reflective interface are weakened and widening the flat portions of the peaks of the spectral transmittance curve of the interference filter for each emission region, thus improving the viewing angle characteristics.

When the formation positions of the first or second light-emitting layers which are provided in common to a plurality of light-emitting devices are shifted in opposite directions or when the thickness of the first or second light-emitting layer is increased to a certain extent, the light-emitting apparatus preferably further includes a reflective layer for maintaining the flatness of the peaks of a spectral transmittance curve of an interference filter of the light-emitting device.

In the light-emitting device, there is a case where an additional reflective layer is formed so as to improve reliability or comply with an employed configuration, and thus an additional reflective interface is formed. In that case, by forming a third reflective interface necessary for an optical operation and then forming a layer having a thickness of at least 1 μm or more, it is possible to substantially ignore the effect of subsequent interference. At that time, an arbitrary material can be used as a material of the outer side of the third reflective interface and the material can be appropriately chosen in accordance with the type of the light-emitting device. Specifically, at least one or two or more of a transparent electrode layer having a thickness of 1 μm or more, a transparent insulating layer, a resin layer, a glass layer, and an air layer is formed on the outer side of the third reflective interface. However, the present invention is not limited to this.

The light-emitting apparatus, illumination apparatus, and display apparatus according to the embodiments of the present invention may have a known configuration and can be appropriately configured in accordance with the purposes or functions thereof. As a typical example, the display apparatus includes a driving substrate on which an active device (for example, a thin-film transistor) is provided so as to supply a display signal corresponding to a display pixel to the light-emitting device, and a sealing substrate provided so as to face the driving substrate. The light-emitting device is disposed between the driving substrate and the sealing substrate. The display apparatus may be a white display apparatus, a black-and-white display apparatus, or a color display apparatus. In a color display apparatus, a color filter which transmits light emitted from the side of the second electrode is typically provided on a substrate that is disposed on the side of the second electrode of the light-emitting device among the driving substrate and the sealing substrate.

According to the embodiments of the present invention, it is possible to realize providing a light-emitting apparatus which is capable of effectively extracting light in a wide wavelength range, greatly reducing a viewing-angle dependency of luminance and hue with respect to light of a single color, and making the thicknesses of the organic layers or the like of the respective pixels identical to each other, and which can be easily manufactured with high productivity.

According to the embodiments of the present invention, it is possible to realize an illumination apparatus which has a small viewing-angle dependency and good intensity distribution properties and which can be easily manufactured with high productivity, and a display apparatus which has a good display quality and a small viewing-angle dependency and which can be easily manufactured with high productivity.

DESCRIPTION OF THE PREFERRED EMBODIMENTS

Hereinafter, modes for carrying out the present invention (hereinafter referred to as embodiments) will be described. The description will be given in the following order:

1. First Embodiment (Organic EL Light-Emitting Apparatus);
2. Second Embodiment (Organic EL Light-Emitting Apparatus);
3. Third Embodiment (Organic EL Light-Emitting Apparatus);
4. Fourth Embodiment (Organic EL Illumination Apparatus); and
5. Fifth Embodiment (organic EL display Apparatus)

1. First Embodiment

<Organic EL Light-Emitting Apparatus>

Figure 1B:
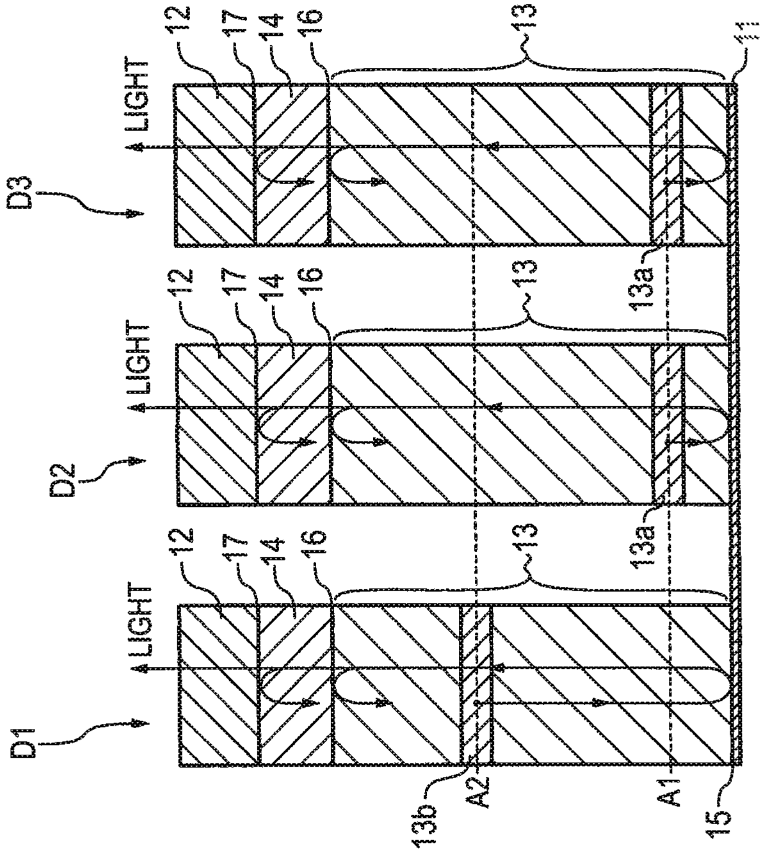
FIGS. 1A and 1B are sectional diagrams showing an organic EL device that constitutes an organic EL light-emitting apparatus according to a first embodiment of the present invention and the organic EL light-emitting apparatus according to the first embodiment of the present invention.
Figure 1A:
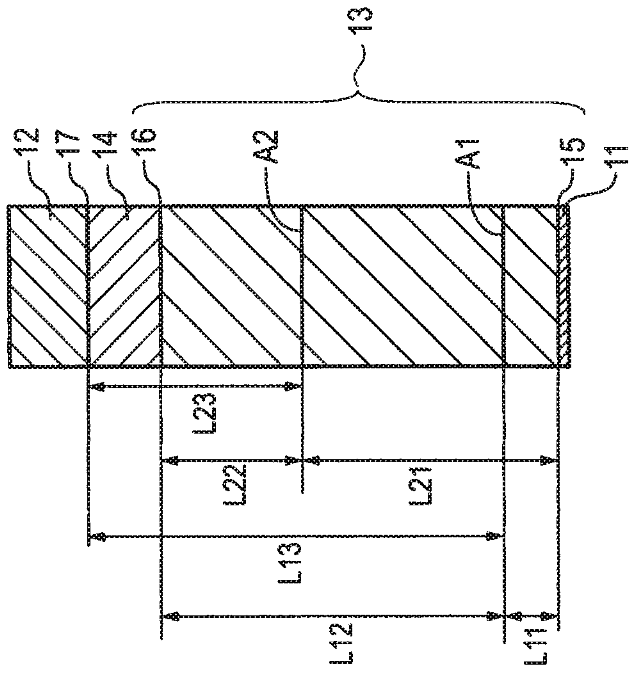

FIG. 1A shows a basic organic EL device that constitutes an organic EL light-emitting apparatus according to the first embodiment, and FIG. 1B shows the organic EL light-emitting apparatus according to the first embodiment which is formed by three kinds of organic EL devices emitting light of different single colors.

As shown in FIG. 1A, in this organic EL device, an organic layer 13 is interposed between a first electrode 11 and a second electrode 12, in which a first light-emitting layer and a second light-emitting layer emitting light of different single colors are included at a first position A1 or a second position A2 separated from each other in the direction from the first electrode 11 to the second electrode 12. Like the existing organic EL device, a hole injection layer, a hole transport layer, an electron transport layer, an electron injection layer, and the like, as necessary, are formed in portions of the organic layer 13 above or under the first light-emitting layer and above or under the second light-emitting layer. In this case, the second electrode 12 is a transparent electrode that transmits visible light, and light is emitted from the side of the second electrode 12. The first light-emitting layer and the second light-emitting layer emit light of different single colors in the visible wavelength region. The emission wavelength of the first light-emitting layer or the second light-emitting layer is appropriately chosen in accordance with the color of light that is to be emitted from the organic EL device. A conductive transparent layer 14 is formed between the organic layer 13 and the second electrode 12. The transparent layer 14 may be formed by two or more layers, as necessary. The first and second electrodes 11 and 12, the organic layer 13, the first and second light-emitting layers, and the transparent layer 14 can be formed by known materials, and the materials thereof are appropriately chosen as necessary.

The refractive index of the organic layer 13 is different from the refractive index of the first electrode 11, and a first reflective interface 15 is formed between the first electrode 11 and the organic layer 13 due to the difference in the refractive index. The first reflective interface 15 may be formed at a position separated from the first electrode 11, as necessary. The first reflective interface 15 has a function of reflecting light emitted from the first light-emitting layer and the second light-emitting layer to be emitted from the side of the second electrode 12. The refractive index of the transparent layer 14 is different from the refractive index of the organic layer 13, and a second reflective interface 16 is formed between the organic layer 13 and the transparent layer 14 due to the difference in the refractive index. Moreover, the refractive index of the transparent layer 14 is different from the refractive index of the second electrode 12, and a third reflective interface 17 is formed between the transparent layer 14 and the second electrode 12 due to the difference in the refractive index.

As shown in FIG. 1B, the organic EL light-emitting apparatus includes a first, a second, and a third organic EL device D1, D2, and D3 emitting different single colors in the visible wavelength region, and may include a plurality of groups each including these three devices, as necessary. The first organic EL device D1 includes a first light-emitting layer 13*b* which is disposed at a second position A2 in the organic layer 13. The second and third organic EL devices D2 and D3 have a first light-emitting layer 13*a* which is disposed at a first position A1 in the organic layer 13. As an example, the first organic EL device D1 emits blue light, the second organic EL device D2 emits red light, and the third organic EL device D3 emits green light, but the present invention is not limited to this. The thicknesses of the organic layers 13 of the first, second, and third organic EL devices D1, D2, and D3 are the same as the thickness of the transparent layer 14.

In FIG. 1A, L11, L21, L12, L22, L13, and L23 are illustrated at corresponding positions. In this embodiment, the luminescent center of the first light-emitting layer 13*a* is identical to the first position A1 in the organic layer 13, and the luminescent center of the second light-emitting layer 13*b* is identical to the second position A2 in the organic layer 13. In the organic EL light-emitting apparatus, L11, L21, L12, L22, L13, and L23 are set so that all the expressions (1) to (6) are satisfied and at least one of the expressions (7) and (8) is satisfied.

A case where the organic EL light-emitting apparatus is a white light-emitting apparatus will be described in detail.

In the white organic EL light-emitting apparatus, the second light-emitting layer 13*b* of the first organic EL device D1 emits blue light, the first light-emitting layer 13*a* of the second organic EL device D2 emits red light, and the first light-emitting layer 13*a* of the third organic EL device D3 emits green light. This organic EL light-emitting apparatus extracts white light as a combined color of these colors. The central wavelength λ1 of the emission spectrum of the second light-emitting layer 13*b* is 460 nm, for example, and the central wavelength λ2 of the emission spectrum of the first light-emitting layer 13*a* is 575 nm, for example, when the second and third organic EL devices D2 and D3 are regarded as a single device.

L11 is set so that light having the central wavelength λ1 of the emission spectrum of the first light-emitting layer 13*a* is reinforced through interference between the first reflective interface 15 and the luminescent center of the first light-emitting layer 13*a*. Moreover, L21 is set so that light having the central wavelength λ2 of the emission spectrum of the second light-emitting layer 13*b* is reinforced through interference between the first reflective interface 15 and the luminescent center of the second light-emitting layer 13*b*. This state can be expressed as the following expressions, and the expressions (1) to (4) are satisfied. In this case, the first light-emitting layer 13*a* is at a position where O-order (m=0 in the expression (1)) interference occurs, a high transmittance is obtained over a wide wavelength range (see the transmittance of an interference filter of the first reflective interface 15 for the first light-emitting layer 13*a* shown in FIG. 2). Moreover, the interference wavelength can be shifted greatly from the central wavelength λ1 of the emission spectrum as shown in the expression (3).

$$\lambda L11/\lambda 11+\phi 1/2\pi=0 \quad (1)'$$

$$2L21/\lambda 21+\phi 1/2\pi=1 \quad (2)'$$

where, $$\lambda 1\text{-}150=425<\lambda 11=540<\lambda 1+80=655\text{ nm} \quad (3)'$$

$$\lambda 2\text{-}30=430<\lambda 21=480<\lambda 2+80=460+80=540\text{ nm} \quad (4)'$$

In the expressions, ϕ1 can be calculated from n and k of a complex refractive index N=n−jk (n: refractive index, k: absorption coefficient) of the first electrode 11 and the refractive index $n_0$ of the organic layer 13 in contact with the first electrode 11 (see, for example, Principles of Optics, Max Born and Emil Wolf, 1974 (PERGAMON PRESS)). The refractive indices of the organic layer 13, the transparent layer 14, and the like can be measured using a spectroscopic ellipsometer.

A specific calculation example of ϕ1 will be described. When the first electrode 11 is made from an aluminum (Al) alloy, n=0.908 and k=5.927 for light having a wavelength of 575 nm (corresponding to the central wavelength λ1 of the emission spectrum of the first light-emitting layer 13*a*). When the refractive index $n_0$ of the organic layer 13 is set as $n_0$=1.75, the following expression is obtained.

$$\phi 1=\tan^{-1}\{2n_0k/(n^2+k^2-n_0^2)\}=\tan^{-1}(0.577)$$

Since −2π<ϕ1≤0, ϕ1 can be calculated as ϕ1=−2.618 radians. When the value of ϕ1 is substituted into the expression (1)', L11 is calculated as L11=114 nm. Moreover, when the value of ϕ1 is substituted into the expression (2)', L21 is calculated as L21=340 nm.

When the refractive index n of the first electrode 11 is larger than the refractive index $n_0$ of the organic layer 13, ϕ1 is shifted further by an amount of it radians. When the refractive index n is smaller than the refractive index $n_0$, the shift amount is 0.

Figure 2:
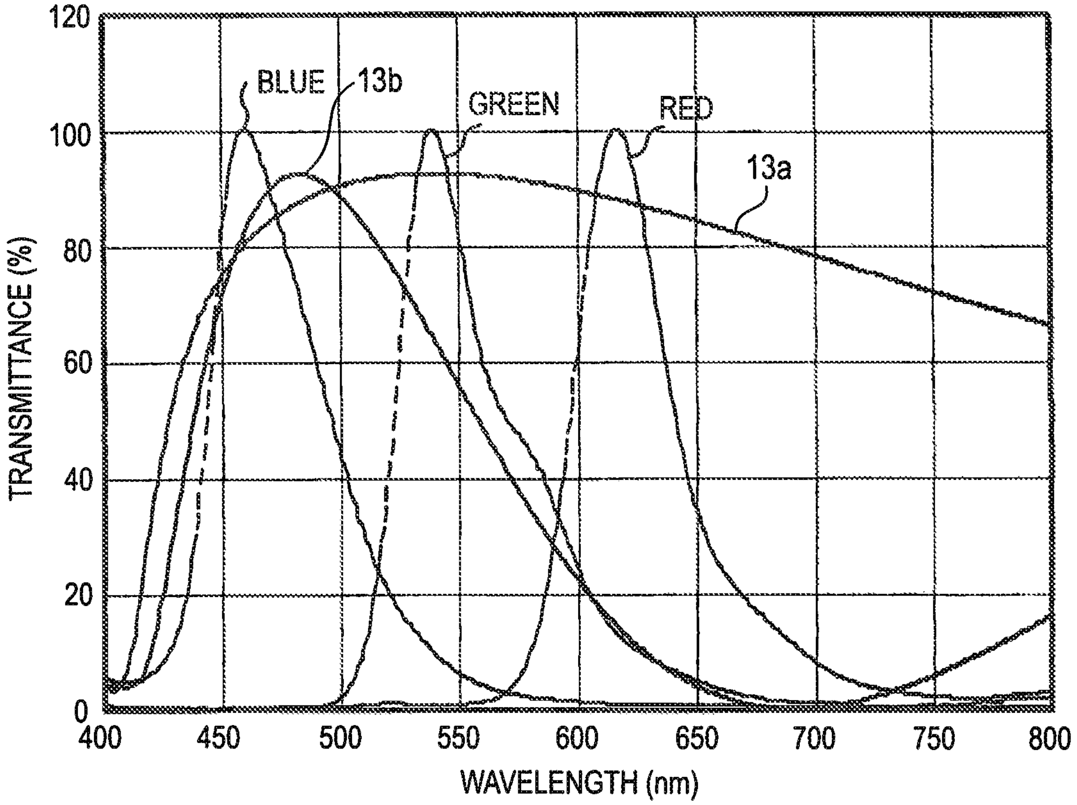
FIG. 2 is a schematic diagram showing the spectral transmittance curves of an interference filter formed by a first reflective interface in the organic EL device that constitutes the organic EL light-emitting apparatus according to the first embodiment of the present invention.

Since the interference filter formed by the first reflective interface 15 is in the constructive condition with respect to the first and second light-emitting layers 13*a* and 13*b*, the spectral transmittance curves have peaks as shown in FIG. 2, and light extraction efficiency is improved. However, when observed from the oblique direction, the wavelength range of the interference filter is shifted towards the short wavelengths, and luminance and hue are changed. In addition, since the wavelength range of the interference filter corresponding to the second light-emitting layer 13*b* is shifted towards the long wavelengths, white light is not sufficiently extracted.

Subsequently, the second reflective interface 16 is formed between the organic layer 13 having the refractive index $n_0$=1.75 and the transparent layer 14 having a refractive index (for example, 2.0) different from the organic layer 13. Moreover, the third reflective interface 16 is formed between the transparent layer 14 and the second electrode 12 having a refractive index (for example, 1.8) different from the transparent layer 14. Indium tin oxide (ITO), for example, can be used as a material of the transparent layer 14 having the refractive index of 2.0, and ITO or the like having a different oxide composition can be used as a material of the second electrode 12 having the refractive index of 1.8. In this case, the reflection of light by the second reflective interface 16 and the reflection of light by the third reflective interface 17 satisfy the following conditions, i.e., the constructive and destructive conditions and a condition for broadening the interference wavelength while the interference wavelengths are shifted from the central wavelengths λ1 and λ2 (λ12≠λ13 or λ22≠λ23).

$$2L12/\lambda 12+\phi 2/2\pi=1+1/2 \quad (5)'$$

$$2L22/\lambda 22+\phi 2/2\pi=1 \quad (6)'$$

$$2L13/\lambda 13+\phi 3/2\pi=3 \quad (5)'$$

$$2L23/\lambda 23+\phi 3/2\pi=2+1/2 \quad (6)'$$

$$\lambda 22=380\text{ nm}<\lambda 2\text{-}15=445\text{ nm} \quad (7)'$$

(where λ12, λ22, λ13, and λ23 are in units of nm)

The values of ϕ2 and ϕ3 can be calculated by the same manner as above.

In this way, all the conditions of the expressions (1) to (7) are satisfied.

Figure 3:
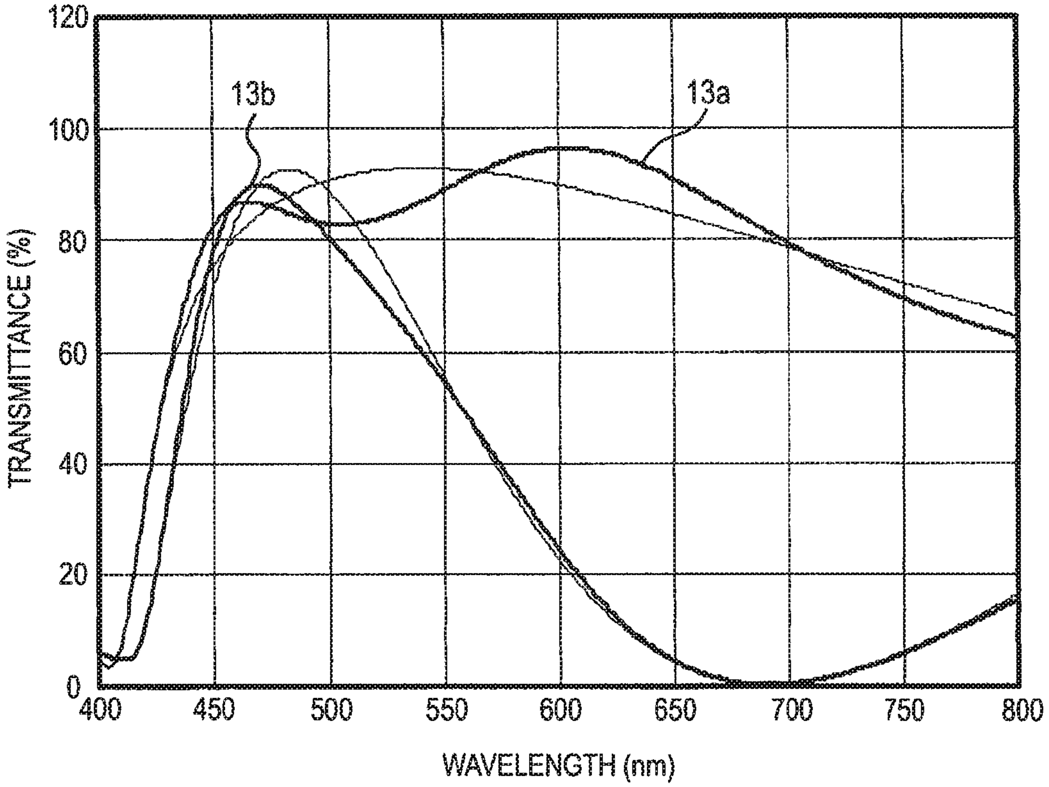
FIG. 3 is a schematic diagram showing spectral transmittance curves of an interference filter formed by a first reflective interface and a combined interference filter formed by first and second reflective interfaces in the organic EL device that constitutes the organic EL light-emitting apparatus according to the first embodiment of the present invention.

FIG. 3 shows the spectral transmittance curves of the interference filter formed by the first and second reflective interfaces 15 and 16. In this case, since the wavelength conditions of the first and second reflective interfaces 15 and 16 are different by an amount of 15 nm or more, the transmittance decreases in a wavelength near 550 nm. Thus, the light of the three colors R, G, and B are not extracted in a well balanced manner, and white light is not obtained. In addition, since a flat portion is not obtained in the spectral transmittance curve, the viewing angle characteristics exhibit a great change from luminance and hue.

Figure 4:
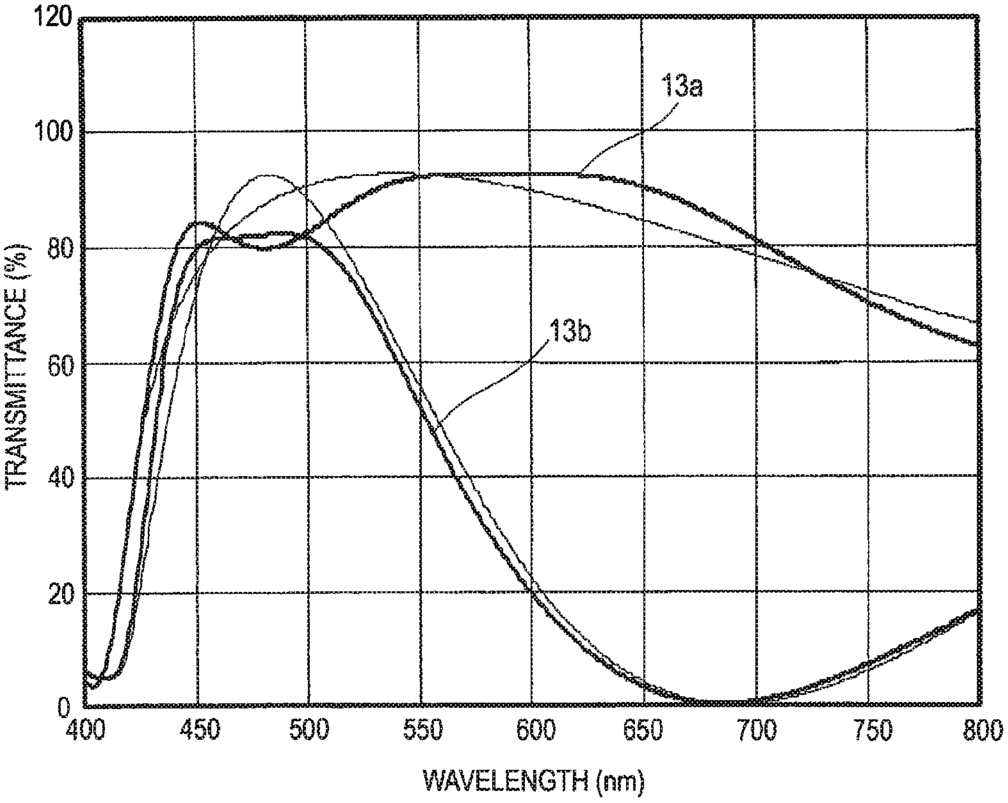
FIG. 4 is a schematic diagram showing the spectral transmittance curves of a combined interference filter formed by first, second, and third reflective interfaces in the organic EL device that constitutes the organic EL light-emitting apparatus according to the first embodiment of the present invention.
Figure 5:
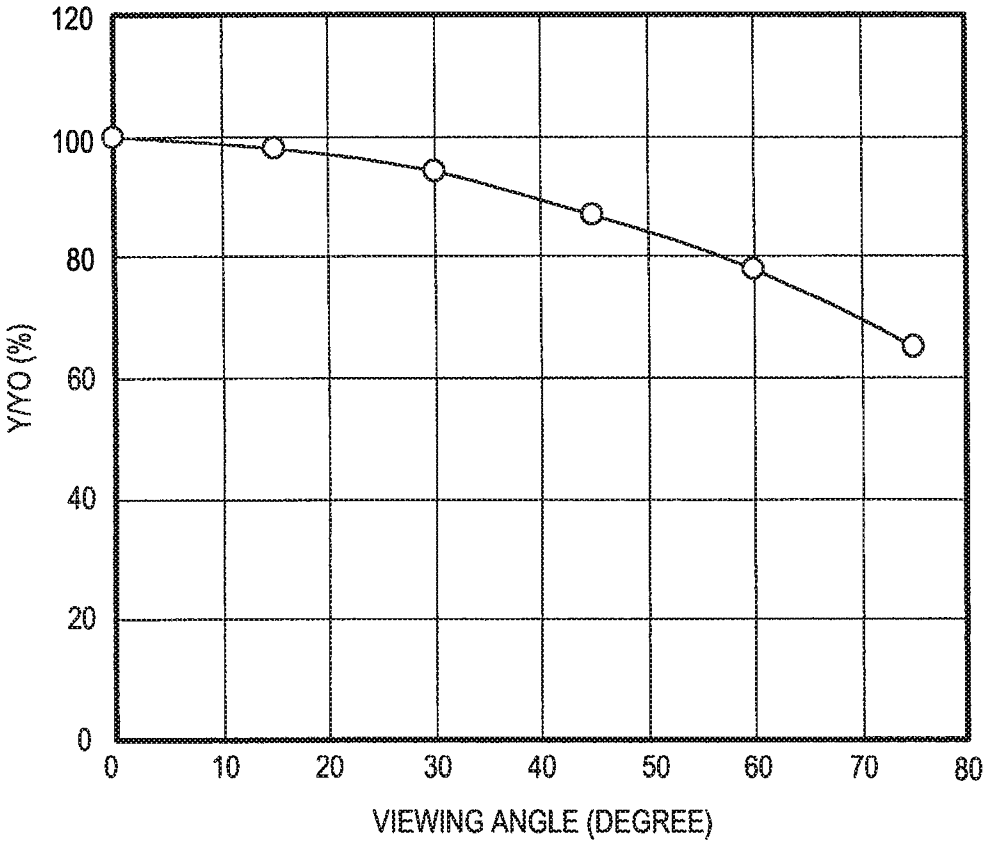
FIG. 5 is a schematic diagram showing the luminance-viewing angle characteristics of the organic EL device that constitutes the organic EL light-emitting apparatus according to the first embodiment of the present invention.
Figure 6:
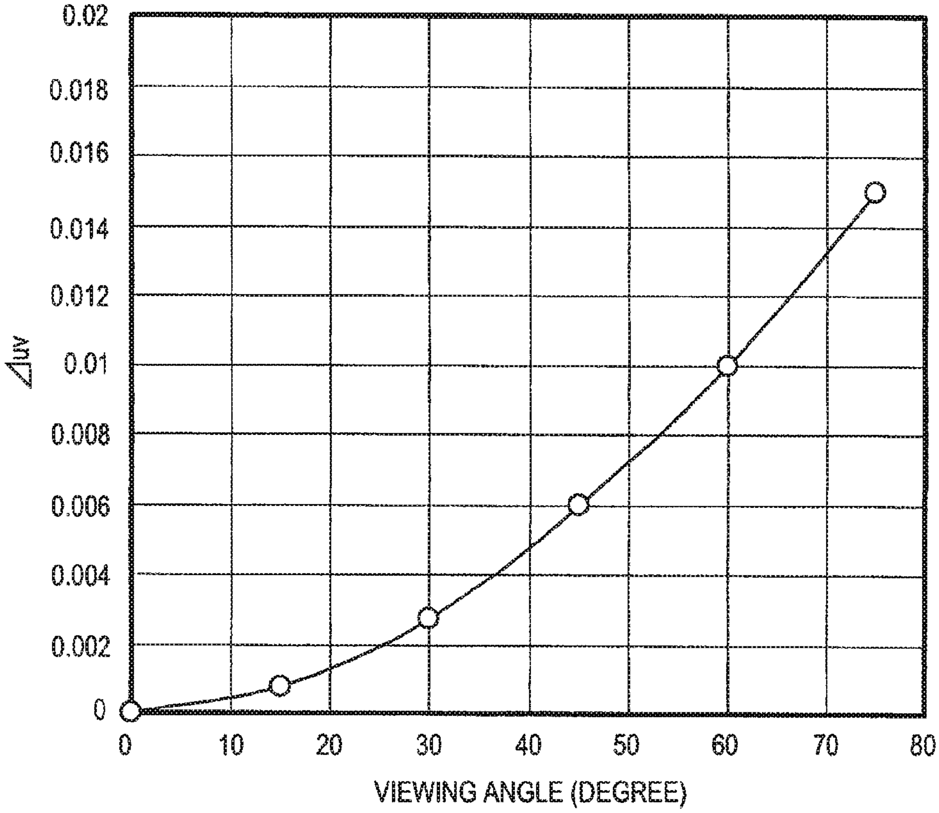
FIG. 6 is a schematic diagram showing the chromaticity-viewing angle characteristics of the organic EL device that constitutes the organic EL light-emitting apparatus according to the first embodiment of the present invention.

FIG. 4 shows the spectral transmittance curves of an interference filter which is formed by the first and second reflective interfaces 15 and 16, and in which the effect of the third reflective interface 17 is included. It can be understood from FIG. 4 that an interference filter of which the spectral transmittance curve is substantially flat in the blue region and the green and red regions is formed. The luminance and chromaticity-viewing angle characteristics of green light in that state are shown in FIGS. 5 and 6, respectively. As is clear from FIGS. 5 and 6, the luminance at the viewing angle of 45° maintains 85% or more of the luminance at the viewing angle of 0°, and a chromaticity shift of $\Delta uv \leq 0.015$ is also achieved. The same applies to the blue and red light.

As described above, according to the first embodiment, the first, second, and third organic EL devices D1, D2, and D3 include the organic layer 13 which is interposed between the first electrode 11 and the second electrode 12 and which includes the first and second light-emitting layers 13*a* and 13*b* emitting light of different single colors in the visible wavelength region. Moreover, the first reflective interface 15 is formed close to the side of the first electrode 11, and the second reflective interface 16 and the third reflective interface 17 are formed close to the side of the second electrode 12 from which light is emitted. Moreover, the distances L11, L21, L12, L22, L13, and L23 shown in FIG. 1A are set so that all the expressions (1) to (6) are satisfied and at least one of the expressions (7) and (8) is satisfied. As a result, this organic EL light-emitting apparatus has an interference filter of which the transmittance is high over a wide wavelength range and thus can effectively extract light in a wide wavelength range. Therefore, according to this organic EL light-emitting apparatus, a white light-emitting apparatus having good hue can be realized. Moreover, this organic EL light-emitting apparatus can achieve a remarkable reduction in the viewing-angle dependency of luminance and hue for a single color. Furthermore, this organic EL light-emitting apparatus allows choice of an emission color by designing the first and second light-emitting layers 13*a* and 13*b*. In addition, this organic EL light-emitting apparatus consumes less power since the transmittance of the interference filter is high. In addition, in this organic EL light-emitting apparatus, the thicknesses of the organic layer 13 and the transparent layer 14 of the first, second, and third organic EL devices D1, D2, and D3 can be made identical to each other. Therefore, this organic EL light-emitting apparatus can be easily manufactured with high productivity.

2. Second Embodiment

<Organic EL Light-Emitting Apparatus>

In an organic EL light-emitting apparatus according to a second embodiment, the second and third reflective interfaces 16 and 17 of the first, second, and third organic EL devices D1, D2, and D3 of the organic EL light-emitting apparatus according to the first embodiment are respectively divided into two front and rear reflective interfaces so as to broaden the wavelength range of the opposite-phase interference conditions shown in the expressions (5) and (6). That is, as for the expression (5), for example, when the second reflective interface 16 is divided into two front and rear reflective interfaces separated by a distance of $\Delta$, L12 becomes L12+4 and L12−$\Delta$, the wavelength range of $\lambda$12 in which the expression (5) is satisfied is broadened. The same applies to the expression (6).

According to the second embodiment, in addition to the same advantages as the first embodiment, since the wavelength range of the opposite-phase interference condition shown in the expressions (5) and (6) can be broadened, it is possible to obtain an advantage that the viewing angle characteristics of the organic EL light-emitting apparatus can be improved further.

3. Third Embodiment

<Organic EL Light-Emitting Apparatus>

In the organic EL light-emitting apparatus according to the first embodiment, there is a case where the portions of the first light-emitting layers 13*a* of the second and third organic EL devices D2 and D3 of the organic EL light-emitting apparatus become thick depending on a manufacturing method of the organic EL device or in order to obtain necessary properties. Moreover, there is a case where it is necessary to shift the formation positions of the first light-emitting layers 13*a* of the second and third organic EL devices D2 and D3 in opposite directions. In such a case, since the spectral transmittance curve of the interference filter is tilted, it is difficult to maintain wide-viewing angle characteristics. As for a countermeasure, the viewing angle characteristics can be improved by additionally providing a fourth reflective interface in addition to the first, second, and third reflective interfaces 15, 16, and 17 of the second and third organic EL devices D2 and D3 of the organic EL light-emitting apparatus according to the first embodiment.

Figure 7A:
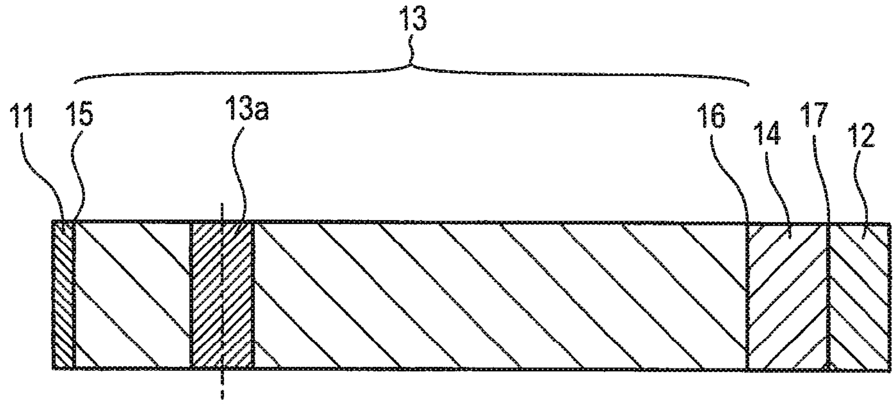
FIGS. 7A and 7B are sectional diagrams showing a case where the formation positions of second light-emitting layers of the organic EL devices emitting different colors that constitute the organic EL light-emitting apparatus according to the first embodiment of the present invention are shifted in opposite directions.
Figure 7B:
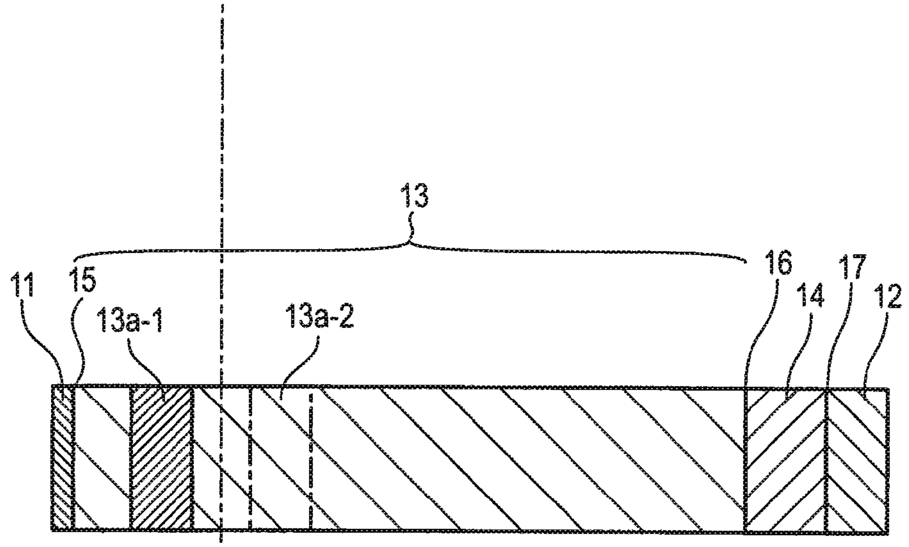
Figure 8:
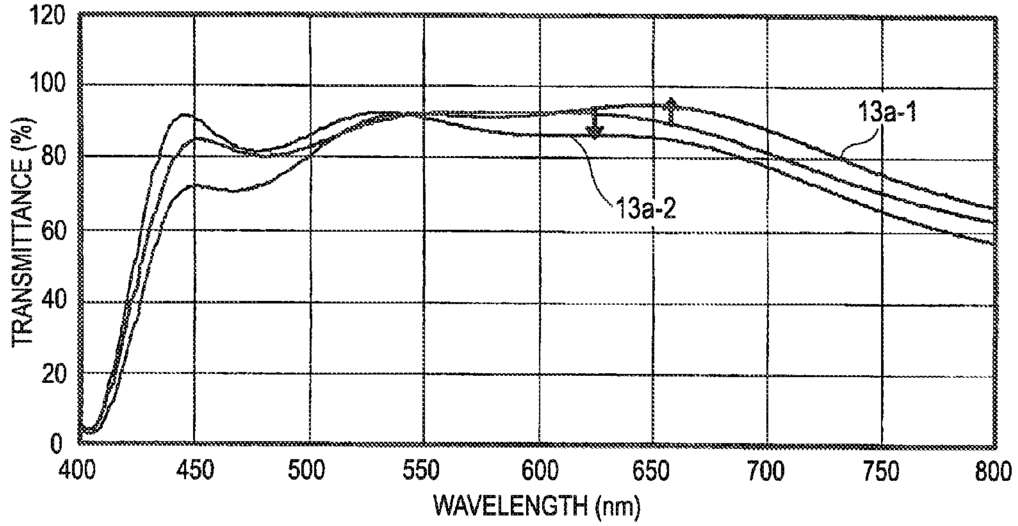
FIG. 8 is a schematic diagram showing the spectral transmittance curves of an interference filter corresponding to the second light-emitting layer of the organic EL device shown in FIGS. 7A and 7B.

In the fourth reflective interface, both the constructive and destructive conditions exist in the range of ±15 nm from the central wavelength $\lambda$1 of the emission spectrum of the first light-emitting layer 13*a*. FIG. 7A shows the second or third organic EL device D2 or D3 of the organic EL light-emitting apparatus according to the first embodiment. In this case, the thickness of the first light-emitting layer 13*a* is relatively as large as 20 nm. In contrast, as shown in FIG. 7B, the position of the first light-emitting layer 13*a* of the second and third organic EL devices D2 and D3 is shifted by an amount of 10 nm from the first position A1 as compared with that in FIG. 7A. A first light-emitting layer 13*a* shifted by an amount of 10 nm from the first position A1 towards the first electrode 11 will be referred to as a first light-emitting layer 13*a*-1, and a first light-emitting layer 13*a* shifted by an amount of 10 nm from the first position A1 towards the second electrode 12 will be referred to as a first light-emitting layer 13*a*-2. As a result, as shown in FIG. 8, slopes in opposite directions appear in the spectral transmittance curves of the interference filters corresponding to the first red light-emitting layer 13*a* of the second organic EL device D2 and the first green light-emitting layer 13*a* of the third organic EL device D3. Therefore, as the viewing angle increases, the transmittance of green light decreases whereas the transmittance of red light increases. Thus, a color shift occurs.

Figure 9:
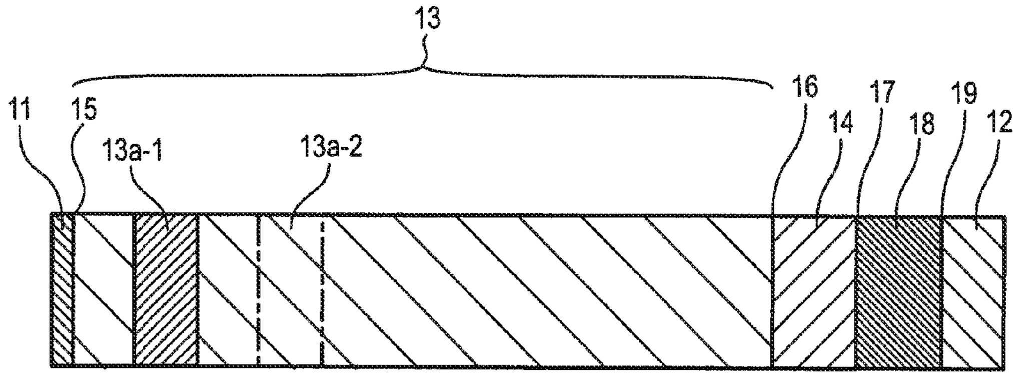
FIG. 9 is a sectional diagram showing an organic EL device that constitutes an organic EL light-emitting apparatus according to a third embodiment of the present invention.
Figure 10:
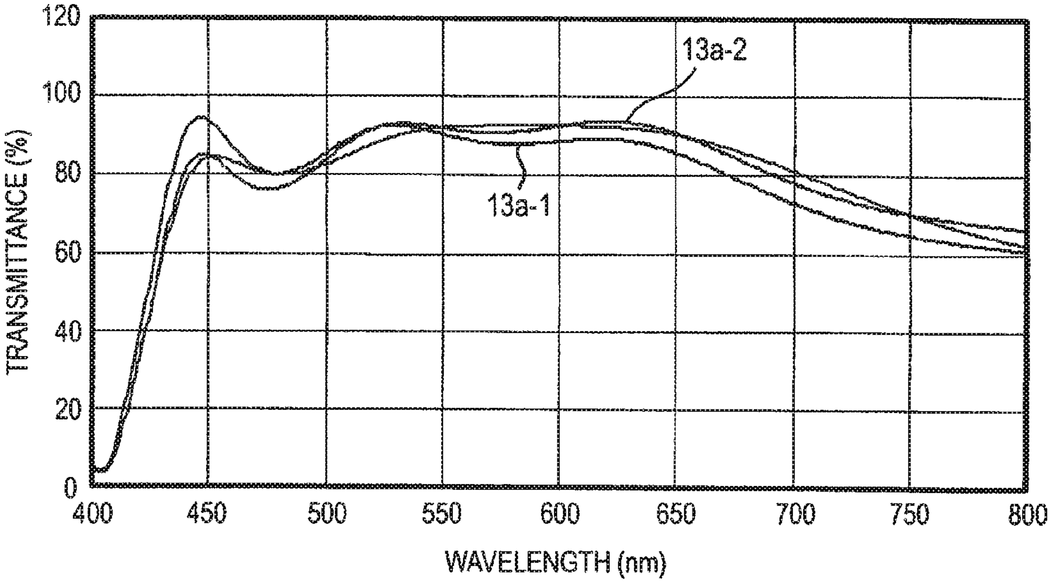
FIG. 10 is a schematic diagram showing the spectral transmittance curves of an interference filter corresponding to a second light-emitting layer of the organic EL device that constitutes the organic EL light-emitting apparatus according to the third embodiment of the present invention.

In the organic EL light-emitting apparatus according to the third embodiment, as shown in FIG. 9, a conductive transparent layer 18 having a refractive index different from the transparent layer 14 is formed on the transparent layer 14, and the second electrode 12 is formed on the transparent layer 18. Moreover, a fourth reflective interface 19 is formed between the transparent layer 18 and the second electrode 12. In this case, the third reflective interface 17 is formed between the transparent layer 14 and the transparent layer 18. The fourth reflective interface 19 is set at a position such that light having the central wavelength λ1 of the emission spectrum of the first light-emitting layer 13*a* is in the constructive condition. By doing so, the interference filters of the light of green and red have the spectral transmittance curves as shown in FIG. 10. Thus, it can be understood that an interference filter having a flat peak can be formed for light of the colors green and red.

When the direction of shifting the first light-emitting layer 13*a* is reversed, the same advantages as above can be obtained by forming the fourth reflective interface 19 at a position such that light having the central wavelength λ1 of the emission spectrum of the first light-emitting layer 13*a* is in the destructive condition.

Figure 11:
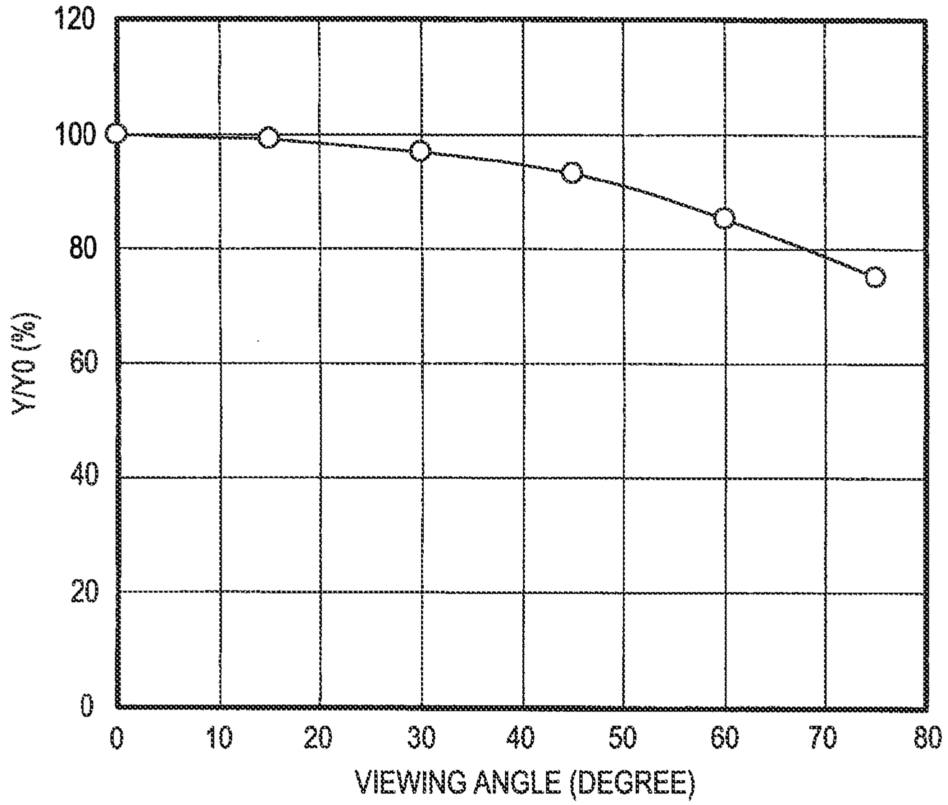
FIG. 11 is a schematic diagram showing the luminance-viewing angle characteristics of the organic EL device that constitutes the organic EL light-emitting apparatus according to the third embodiment of the present invention.
Figure 12:
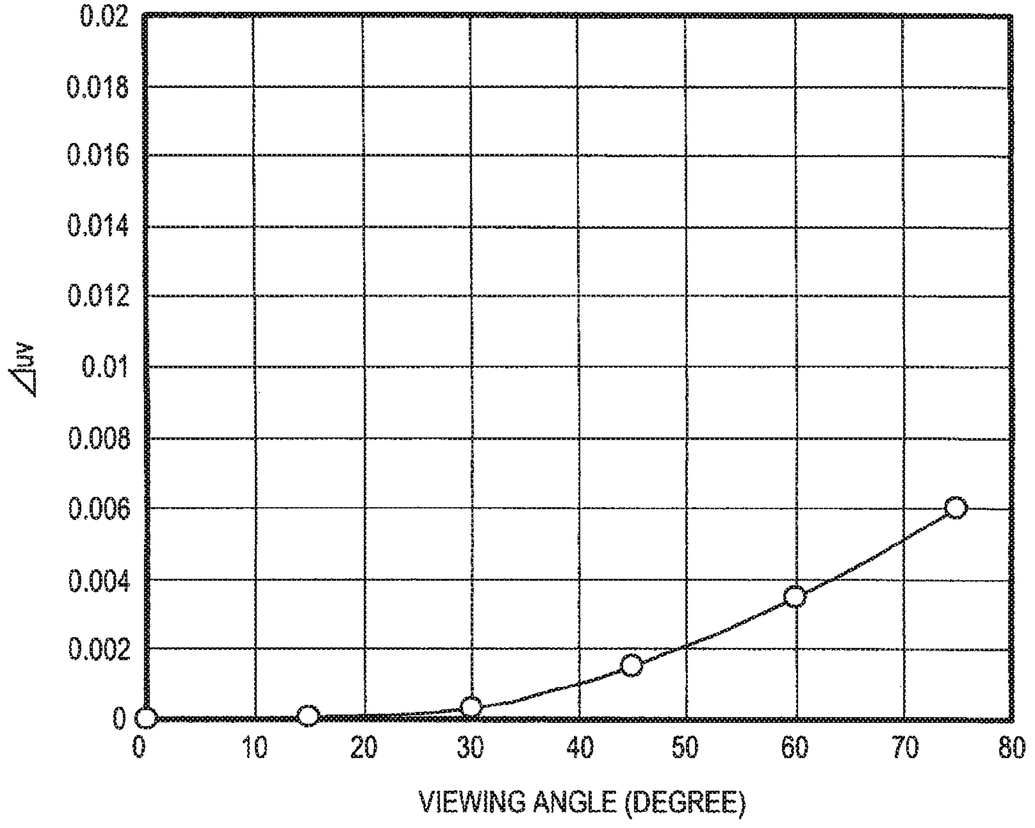
FIG. 12 is a schematic diagram showing the chromaticity-viewing angle characteristics of the organic EL device that constitutes the organic EL light-emitting apparatus according to the third embodiment of the present invention.

The luminance and chromaticity-viewing angle characteristics of green light of the organic EL light-emitting apparatus according to the third embodiment having the fourth reflective interface 19 are shown in FIGS. 11 and 12. It can be understood from FIGS. 11 and 12 that according to this organic EL light-emitting apparatus, the luminance and chromaticity-viewing angle characteristics are improved further as compared with the organic EL light-emitting apparatus according to the first embodiment.

Example 1

Example 1 is an example corresponding to the first embodiment.

Figure 13:
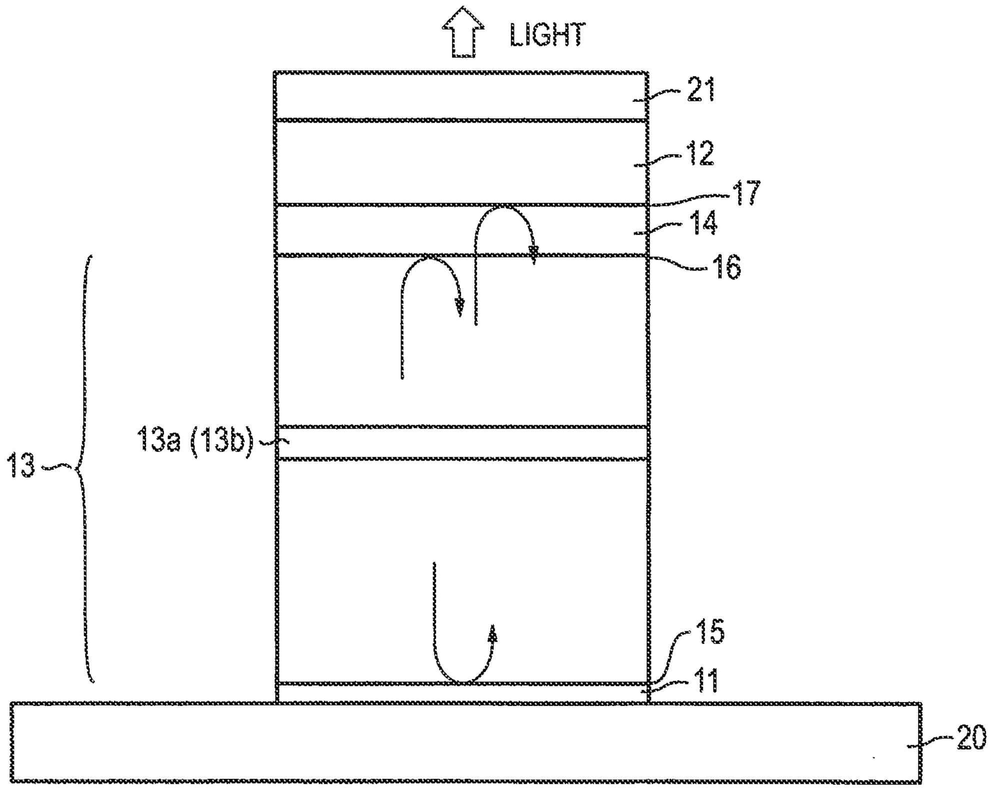
FIG. 13 is a sectional diagram showing a top emission-type organic EL device that constitutes an organic EL light-emitting apparatus according to Example 1.

FIG. 13 shows an organic EL device that forms a top emission-type organic EL light-emitting apparatus according to Example 1. This organic EL device is a top emission-type organic EL device. As shown in FIG. 13, in this organic EL device, a first electrode 11, an organic layer 13, a transparent layer 14, and a second electrode 15 are sequentially stacked on a substrate 20 in that order from the lower side, and a passivation film 21 is formed on the second electrode 12. The organic layer 13 includes a first light-emitting layer 13*a* or a second light-emitting layer 13*b*.

The substrate 20 is formed, for example, of a transparent glass substrate or a semiconductor substrate (for example, a silicon substrate) and may be flexible. The first electrode 11 is an anode electrode also serving as a reflective layer and is formed from a light reflective material, for example, aluminum (Al), aluminum alloy, platinum (Pt), gold (Au), chromium (Cr), and tungsten (W). The thickness of the first electrode 11 is preferably set to be in the range of 100 to 300 nm. The first electrode 12 may be a transparent electrode. In this case, it is preferable to form a reflective layer made from a light reflective material, for example, Pt, Au, Cr, and W, for the purpose of forming the first reflective interface 15 between the first electrode 12 and the substrate 20.

The organic layer 13 has a structure in which a hole injection layer, a hole transport layer, a first light-emitting layer 13*a* or a second light-emitting layer 13*b*, an electron transport layer, and an electron injection layer are sequentially stacked in that order from the lower side. The hole injection layer is formed, for example, from hexaazatriphenylene (HAT). The hole transport layer is formed, for example, from α-NPD [N,N'-di(1-naphthyl)-N,N'-diphenyl-[1,1'-biphenyl]-4,4'-di amine]. The first light-emitting layer 13*a* is formed from a light emitting material having the green or red emission color. As for the light emitting material having the green emission color, Alq3 (tris-quinolinolaluminum complex) can be used, for example. As for the light emitting material having the red emission color, a material obtained by doping pyrromethene-boron complex into rubrene used as a host material can be used, for example. The second light-emitting layer 13*b* is formed from a light emitting material having the blue (B) emission color. Specifically, ADN (9,10-di(2-naphthyl) anthracene is deposited as a host material to form a film having a thickness of 20 nm. At that time, a diaminochrysene derivative is doped into the ADN as an impurity material by an amount of 5% in the relative thickness ratio, whereby the film can be used as a blue light-emitting layer. The electron transport layer is formed, for example, from BCP (2,9-dimethyl-4,7-diphenyl-1,10-phenanthroline). The electron injection layer is formed, for example, of lithium fluoride (LiF).

The thickness of each layer of the organic layer 13 is preferably set in the ranges of 1 to 20 nm for the hole injection layer, 15 to 100 nm for the hole transport layer, 5 to 50 nm for the first or second light-emitting layer 13*a* or 13*b*, and 15 to 200 nm for the electron injection layer and the electron transport layer. The thicknesses of the organic layer 13 and each constituent layer are set to a value such that the optical thicknesses thereof enable the above-mentioned operations.

The second reflective interface 16 is formed by forming a conductive transparent layer 14 on the organic layer 13 and using the difference in the refractive indices between the organic layer 13 and the transparent layer 14. Moreover, the third reflective interface 17 is formed by using the difference in the refractive indices between the transparent layer 14 and the second electrode 12. The transparent layer 14 may not be a layer made up of one layer but may be a stacked structure of two or more transparent layers having different refractive indices depending on a necessary flat wavelength range and the viewing angle characteristics.

The second electrode 12 from which light is extracted is formed from ITO that is generally used as a transparent electrode material, an oxide of indium and zinc, and the like and is used as a cathode electrode. The thickness of the second electrode 12 is in the range of 30 to 3000 nm, for example.

The second electrode 12 may also serve as the transparent layer 14, and in this case, the second reflective interface 16 is formed between the organic layer 13 and the second electrode 12.

The passivation film 21 is formed from a transparent dielectric material. The transparent dielectric may not necessarily have approximately the same refractive index as the material of the second electrode 12. When the second electrode 12 also serves as the transparent layer 14 as described above, the interface between the second electrode 12 and the passivation film 21 may serve as the second or third reflective interface 16 or 17 by using the difference in the refractive indices thereof. As the transparent dielectric material, silicon dioxide ($SiO_2$), silicon nitride (SiN), and the like can be used, for example. The thickness of the passivation film 21 is in the range of 500 to 10000 nm, for example.

A semitransparent reflective layer may be formed between the organic layer 13 and the transparent layer 14, as necessary. The semitransparent reflective layer is formed of a metal layer, for example, of magnesium (Mg), silver (Ag), or an alloy thereof, and the thickness is set to 5 nm or less, and preferably in the range of 3 to 4 nm or less.

Example 2

Example 2 is an example corresponding to the first embodiment.

Figure 14:
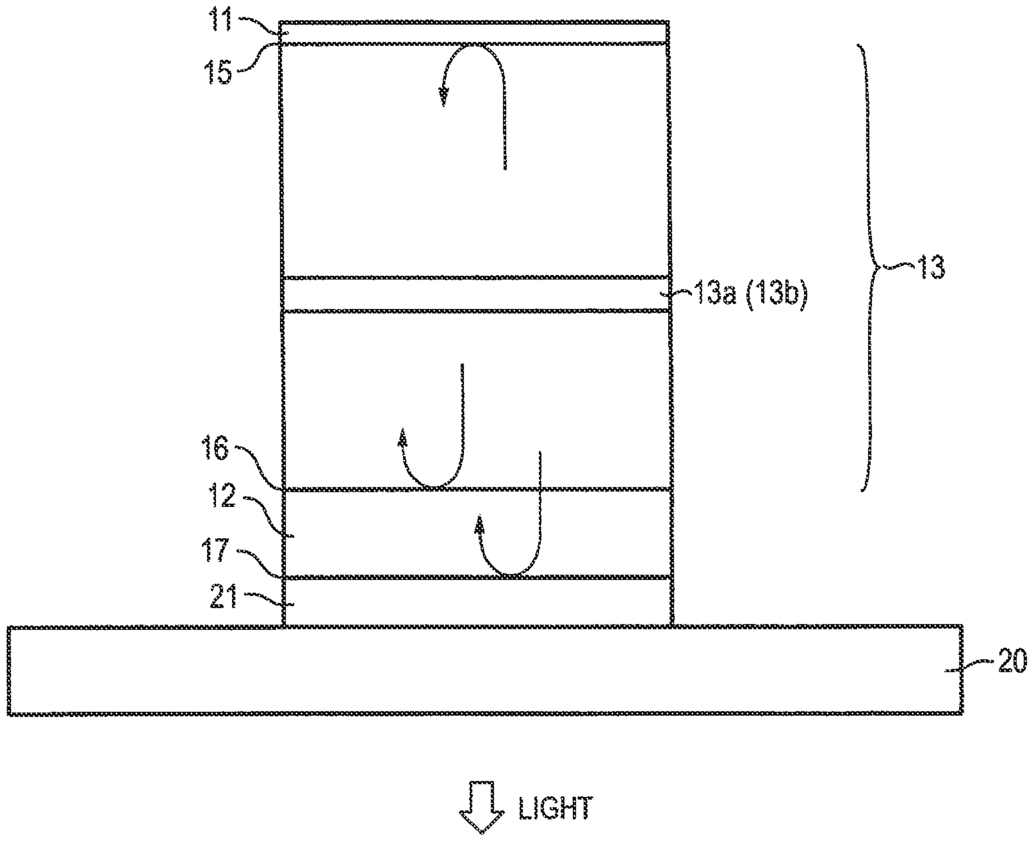
FIG. 14 is a sectional diagram showing a bottom emission-type organic EL device that constitutes an organic EL light-emitting apparatus according to Example 2.

FIG. 14 shows an organic EL device that forms a bottom emission-type organic EL light-emitting apparatus according to Example 2. This organic EL device is a bottom emission-type organic EL device. As shown in FIG. 14, in this organic EL device, a passivation film 21, a second electrode 12, an organic layer 13, and a first electrode 11 are sequentially stacked on a transparent substrate 20 in that order from the lower side. In this case, light emitted from the side of the second electrode 12 passes through the substrate 20 to be extracted to the outside. The second electrode 12 also serves as the transparent layer 14 of Example 1. Moreover, a second reflective interface 16 is formed between the organic layer 13 and the second electrode 12, and a third reflective interface 17 is formed between the second electrode 12 and the passivation film 21. Other configurations are the same as Example 1.

4. Fourth Embodiment

<Organic EL Illumination Apparatus>

Figure 15:
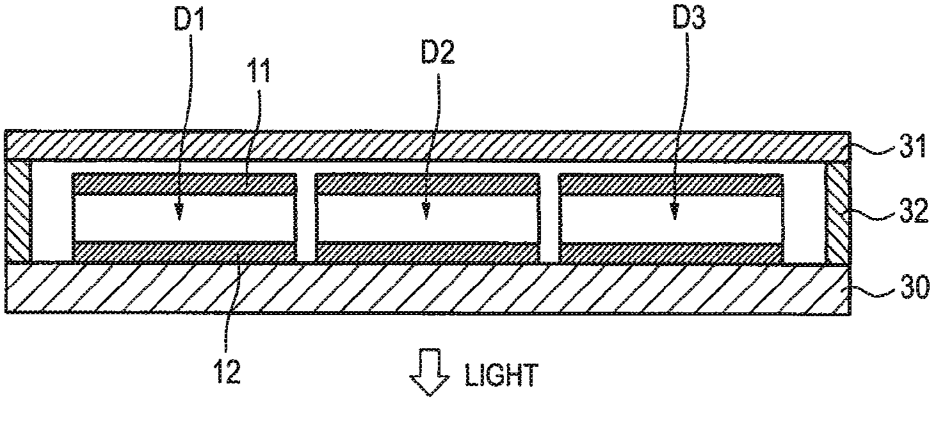
FIG. 15 is a sectional diagram showing an organic EL illumination apparatus according to a fourth embodiment of the present invention.

FIG. 15 shows an organic EL illumination apparatus according to a fourth embodiment.

As shown in FIG. 15, in this organic EL illumination apparatus, the first, second, and third organic EL devices D1, D2, and D3 of the organic EL light-emitting apparatus according to any one of the first to third embodiments is mounted on a transparent substrate 30. In this case, the first, second, and third organic EL devices D1, D2, and D3 are mounted on the substrate 30 with the side of the second electrode 12 facing downward. Thus, light emitted from the side of the second electrode 12 passes through the substrate 30 to be extracted to the outside. A sealing substrate 31 is provided so as to face the substrate 30 with the first, second, and third organic EL devices D1, D2, and D3 interposed therebetween, and the outer peripheral portions of the sealing substrate 31 and the substrate 30 are sealed by a sealing material 32. The top-view shape of the organic EL illumination apparatus is chosen as necessary, and is square or rectangular, for example. Although only one set of the first, second, and third organic EL devices D1, D2, and D3 is shown in FIG. 15, a plurality of sets of the organic EL devices may be mounted on the substrate 30 in a desired layout, as necessary. The details of a configuration of the organic EL illumination apparatus other than the first, second, and third organic EL devices D1, D2, and D3 and the other configurations are the same as those of a known organic EL illumination apparatus.

According to the fourth embodiment, the first, second, and third organic EL devices D1, D2, and D3 of the organic EL light-emitting apparatus according to any one of the first to third embodiments is used. Therefore, it is possible to realize an organic EL illumination apparatus which serves as a field light source having good intensity distribution properties and small viewing-angle dependency (i.e., a variation in intensity or color in accordance with an illumination direction is very small). Moreover, by choosing the emission colors of the first, second, and third organic EL devices D1, D2, and D3 by designing the first and second light-emitting layers 13*a* and 13*b*, it is possible to obtain various emission colors other than white emission color. Thus, it is possible to realize an organic EL illumination apparatus having excellent color rendering properties. Moreover, similarly to the first embodiment, since the thicknesses of the organic layer 13 and the transparent layer 14 of the first, second, and third organic EL devices D1, D2, and D3 can be made identical to each other, this organic EL illumination apparatus can be easily manufactured with high productivity.

5. Fifth Embodiment

<Organic EL Display Apparatus>

Figure 16:
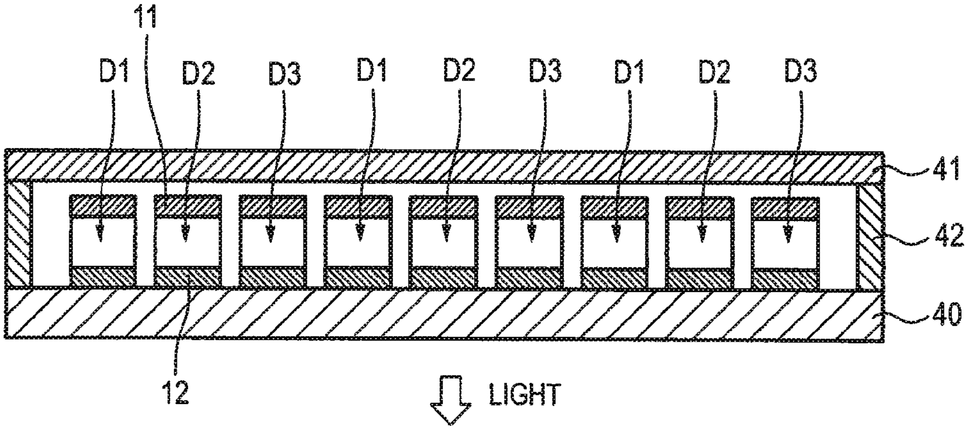
FIG. 16 is a sectional diagram showing an organic EL display apparatus according to a fifth embodiment of the present invention.

FIG. 16 shows an organic EL display apparatus according to a fifth embodiment. This organic EL display apparatus is an active matrix-type display apparatus.

As shown in FIG. 16, in this organic EL display apparatus, a driving substrate 40 and a sealing substrate 41 are provided so as to face each other, and the outer peripheral portions of the driving substrate 40 and the sealing substrate 41 are sealed by a sealing material 42. In the driving substrate 40, pixels formed of the first, second, and third organic EL devices D1, D2, and D3 of the organic EL light-emitting apparatus according to any one of the first to third embodiments are formed on a transparent glass substrate, for example, in a 2-dimensional array form. On the driving substrate 40, a thin-film transistor used as a pixel driving active device is formed for each pixel. In addition, on the driving substrate 40, scanning lines, current supply lines, and data lines for driving the thin-film transistors of the respective pixels are formed in the vertical and horizontal directions. A display signal corresponding to a display pixel is supplied to the thin-film transistors of the respective pixels, and the pixels are driven in accordance with the display signals, and images are displayed. The details of a configuration of the organic EL display apparatus other than the first, second, and third organic EL devices D1, D2, and D3 and the other configurations are the same as those of a known organic EL display apparatus.

This organic EL display apparatus can be used as a color display apparatus as well as a black-and-white display apparatus. When this organic EL display apparatus is used as a color display apparatus, an RGB color filter is provided on the side of the driving substrate 40, specifically between the second electrode 12 of the first, second, and third organic EL devices D1, D2, and D3 and the driving substrate 40, for example.

According to the fifth embodiment, since the first, second, and third organic EL devices D1, D2, and D3 of the organic EL light-emitting apparatus according to any one of first to third embodiments is used. Therefore, it is possible to realize an organic EL display apparatus which has a high display quality and in which a variation in luminance and hue in accordance with a viewing angle is very small. Moreover, similarly to the first embodiment, since the thicknesses of the organic layer 13 and the transparent layer 14 of the first, second, and third organic EL devices D1, D2, and D3 can be made identical to each other, this organic EL display apparatus can be easily manufactured with high productivity.

While specific embodiments and examples of the present invention have been described in detail, the present invention is not limited to those embodiments and examples described above, but various changes and modifications may be effected therein based on the technical spirit of the invention.

For example, numerical values, structures, configurations, shapes, materials, and the like shown in the foregoing embodiments and examples are no more than mere examples, and other appropriate numerical values, structures, configurations, shapes, materials, and the like, can be optionally used.

The present application contains subject matter related to that disclosed in Japanese Priority Patent Application JP 2010-018493 filed in the Japan Patent Office on Jan. 29, 2010, the entire contents of which is hereby incorporated by reference.

What is claimed is:

1. A light-emitting apparatus comprising a plurality of light-emitting devices configured to emit light, wherein:

each light-emitting device includes an organic layer between a first electrode and a second electrode, and the organic layer includes:

a first light-emitting layer configured to emit light, (ii) a second light-emitting layer configured to emit light in a different wavelength than the first light-emitting layer, (iii) a first reflective interface facing the second electrode and at a position within the organic layer such that the intensity of light reflected from the first and second light emitting layers is greater than the intensity of the light emitted from the first light and second light emitting layers, (iv) a second reflective interface facing the first electrode and at a position within the organic layer such that the wavelength range of the light reflected from the first and second light emitting layers is broader than the wavelength of light emitted from the first and second light emitting layers, and (v) a third reflective interface facing the first electrode and at a position within the organic layer such that the wavelength range of the light reflected from the first and second light emitting layers is broader than the wavelength of light emitted from the first and second light emitting layers.

2. The light-emitting apparatus according to claim 1, further comprising an interference filter in the organic layer the wherein peaks of a spectral transmittance curve from the interference filter are substantially flat in the visible wavelength region, or have substantially the same slopes.

3. The light-emitting apparatus according to claim 2, wherein a decrease of luminance of the light-emitting device at a viewing angle of 45° is 30% or less with respect to luminance at a viewing angle of 0°, and a chromaticity shift of $\alpha uv \leq 0.015$ is obtained.

4. The light-emitting apparatus according to claim 1, wherein the first electrode, the organic layer, and the second electrode are sequentially stacked in that order on a substrate.

5. The light-emitting apparatus according to claim 4, wherein at least one of a transparent electrode layer having a thickness of 1 μm or more, a transparent insulating layer, a resin layer, a glass layer, or an air layer is on an outer side of the third reflective interface.

6. The light-emitting apparatus according to claim 1, wherein the second electrode, the organic layer, and the first electrode are sequentially stacked in that order on a substrate.

7. The light-emitting apparatus according to claim 6, wherein at least one of a transparent electrode layer having a thickness of 1 μm or more, a transparent insulating layer, a resin layer, a glass layer, or an air layer is on an outer side of the third reflective interface.

8. The light-emitting apparatus according to claim 1, wherein a metal layer having a thickness of 5 nm or less is between the second light-emitting layer and the second electrode.

9. The light-emitting device according to claim 1, wherein at least one of the first reflective interface, the second reflective interface, and the third reflective interface is divided into a plurality of reflective interfaces.

10. The light-emitting device according to claim 1, further comprising a reflective layer configured to maintain the flatness of the peaks of a spectral transmittance curve of an interference filter of the light-emitting device.

11. An illumination apparatus comprising a plurality of light-emitting devices emitting light in a visible wavelength region, wherein:

each light-emitting device includes an organic layer between a first electrode and a second electrode and the organic layer includes:

(i) a first light-emitting layer configured to emit light, (ii) a second light-emitting layer configured to emit light in a different wavelength than the first light-emitting layer (iii) a first reflective interface on a side of the first electrode facing the second electrode and at a position within the organic layer such that the intensity of light reflected from the first and second light emitting layers is greater than the intensity of the light emitted from the first light and second light emitting layers, (iv) a second reflective interface facing the first electrode and at a position within the organic layer such that the wavelength range of the light reflected from the first and second light emitting layers is broader than the wavelength of light emitted from the first and second light emitting layers, and (v) a third reflective interface facing the first electrode and at a position within the organic layer such that the wavelength range of the light reflected from the first and second light emitting layers is broader than the wavelength of light emitted from the first and second light emitting layers.

12. A display apparatus comprising a plurality of light-emitting devices emitting light in a visible wavelength region, wherein:

each light-emitting device includes an organic layer between a first electrode and a second electrode and the organic layer includes:

(i) a first light-emitting layer configured to emit light, (ii) a second light-emitting layer configured to emit light in a different wavelength than the first light-emitting layer, (iii) a first reflective interface which facing the second electrode and at a position within the organic layer such that the intensity of light reflected from the first and second light emitting layers is greater than the intensity of the light emitted from the first light and second light emitting layers, (iv) a second reflective interface facing the first electrode and at a position within the organic layer such that the wavelength range of the light reflected from the first and second light emitting layers is broader than the wavelength of light emitted from the first and second light emitting layers, and (v) a third reflective interface facing the first electrode and at a position within the organic layer such that the wavelength range of the light reflected from the first and second light emitting layers is broader than the wavelength of light emitted from the first and second light emitting layers.

13. The display apparatus according to claim 12, further comprising:

a driving substrate;

an active device on the driving substrate, the active device configured to supply a display signal corresponding to a display pixel to the light-emitting device; and a sealing substrate facing the driving substrate, wherein, the light-emitting device is between the driving substrate and the sealing substrate.

14. The display apparatus according to claim 13, wherein a color filter configured to transmit light emitted from the second electrode is on a substrate facing the driving substrate and the sealing substrate.

* * * * *